United States Patent [19]
Le Roux

[11] Patent Number: 5,233,516
[45] Date of Patent: Aug. 3, 1993

[54] METHOD FOR RECORDING MOVEMENTS INSIDE AN OBJECT AND FOR SHOWING ON AN IMAGE DISPLAY THE EFFECTS OF THESE MOVEMENTS

[75] Inventor: Patrick Le Roux, Gyf sur Yvette, France

[73] Assignee: General Electric CGR S.A., Issy Less Moulineaux, France

[21] Appl. No.: 206,810

[22] Filed: Jun. 15, 1988

[30] Foreign Application Priority Data

Jun. 19, 1987 [FR] France ............................ 87 08658

[51] Int. Cl.$^5$ .............................................. G06F 15/42
[52] U.S. Cl. ................................................ 364/413.13
[58] Field of Search ............... 364/413.13, 413.05, 364/413.06, 413.22, 413.19; 324/306, 309; 128/653

[56] References Cited

U.S. PATENT DOCUMENTS

| | | | |
|---|---|---|---|
| 4,458,688 | 7/1984 | Von Behren | 364/413.13 |
| 4,620,153 | 10/1986 | Hino | 364/413.13 |
| 4,830,012 | 5/1989 | Riederer | 364/413.13 |
| 4,855,910 | 8/1989 | Bohning | 364/413.13 |
| 4,860,221 | 8/1989 | Sato et al. | 364/413.22 |

*Primary Examiner*—Gail O. Hayes
*Attorney, Agent, or Firm*—Nilles & Nilles

[57] ABSTRACT

In an NMR experiment, the movements of an object are represented by carrying out a harmonic analysis of the images based on a resolution of the movement of the object into a Fourier series. There is then obtained a set of images which is representative of the Fourier components of this movement. The images are then recombined at will so as to produce either a general moving image, or an image of those parts which are motionless in the object, or finally an image of only those parts which are in motion.

7 Claims, 4 Drawing Sheets

FIG.4

METHOD FOR RECORDING MOVEMENTS INSIDE AN OBJECT AND FOR SHOWING ON AN IMAGE DISPLAY THE EFFECTS OF THESE MOVEMENTS

BACKGROUND OF THE INVENTION

1. Field of the Invention

The present invention relates to a method whereby the movements of an object are recorded in an image. A primary application of the invention is in the medical field in which it is sought to represent heart motion, lung motion or blood flow or on the contrary to remove from the image any disturbances resulting from motion artifacts. The invention will be described in the case of a nuclear magnetic resonance (NMR) imaging application without being thereby specifically limited to this application. Similarly, the invention will be studied in the case of cyclic movements to which it can readily be applied. However, it can also be adapted to movements which occur only once.

2. Description of the Prior Art

In conventional practice, the representation of moving objects involves acquisition of successive images (the term "image" being clearly used in a broad sense) uniformly spaced in time during the movement to be studied. By displaying these images at a low rate, the movement of the object can be closely studied. By means of cameras, modern methods of television permit the application of this technique on condition that the cameras are sufficiently fast to acquire images which are very close to each other in time and also on condition that these images are subsequently displayed by slowing-down the projection rate. Unfortunately, these general techniques are not readily applicable to methods of imaging by nuclear magnetic resonance (NMR) or even to methods of representation of tomodensitometric cross-sections obtained with tomodensitometers.

In fact, the acquisition of tomographic images with instruments of this type is obtained only after a treatment involving reconstruction of the cross-section images. In the NMR technique, for example, the body particles located in the cross-section of a patient's body to be studied are subjected to an excitation sequence during experimentation and restitute at the output a signal containing an item of information which is representative of their nature. Unfortunately, all the particles of the cross-section re-emit a signal at the same time. With the known methods of image reconstruction, the difficulty of this simultaneous response is circumvented by reiterating the experiments a certain number of times and by changing the conditions of acquisition of the signal from one experiment to another. Typically in NMR imaging, 256 successive experiments are performed over a total period having a minimum duration in the vicinity of half a minute. In the field of tomodensitometric images, the total time of acquisition of all the views (frames) is of the order of one second. Now in one case as in the other, the cycles of fluctuation of the human body, for example in the region of the heart, are of the same order. In consequence, the total number of acquired sequences or the total number of detected views is obtained during a period in the vicinity of that of the heartbeat. Thus the images are fuzzy in the immediate region of the heart.

In order to overcome this disadvantage of motion, an initial solution consisted in carrying out a synchronization. However, and particularly in NMR, the most rapid methods of excitation known as steadystate free precession (SSFP) and corresponding to free precession in a state of balance of magnetic moments of the particles must be applied to a natural frequency. This natural frequency depends on the spin-spin relaxation time (designated as $T_2$) of the magnetic moments of the particles to be studied. It is apparent that this natural frequency opposes synchronization. There is in fact no reason why this natural frequency should be a multiple of the heart rate. If synchronization is adopted (and consequently if the idea of the SSFP mode is abandoned) and if it is desired in addition to produce an image which is said to be in $T_2$ (in order to show the spin-spin relaxation times), it is in that case necessary to wait between each experiment for a period of time equal to three or four times the interval $T_1$ (spin-lattice relaxation time) which is characteristic of the particles under study. In other words, the duration of each experiment is of the order of two seconds. The acquisition of the 256 sequences then leads to a time-duration of about 10 minutes for a single synchronized image during the cycle, taking into account the losses of time during synchronizations. However, physicians require about 32 images for a complete cardiac cycle in order to be able to gain a clear understanding of functioning of the heart. This results in a total examination time of 5 hours. A period of this length, however, is quite intolerable for patients. Furthermore, even assuming that patients could tolerate such a long period of examination, the cardiac cycle is not constant. The result is that synchronization of the other instants of the cycle with respect to a precise date of the cycle does not always correspond to the same state of the heart. A phase lead or phase lag with respect to a predetermined state of the heart depends on the acceleration or slowing-down of the heart rate with respect to a nominal estimated heart rate. As a result, the images exhibit artifacts.

In an alternative mode of excitation known as fast $T_2$ with limited flip-over and with synchronization, it is possible to achieve a much higher speed since typically a fast $T_2$ cycle lasts approximately 50 ms. In consequence, 32 phases of the cardiac cycle can be acquired over a period substantially equal to twice this cycle. In imaging with normal resolution (256 sequences per phase), this results in a total experiment time of 10 minutes. However, fast $T_2$ imaging cannot be carried out simultaneously in a single slice since the NMR signal is excessively attenuated and there is a loss of contrast. There is accordingly employed a multislice technique so as to perform measurements in other cross-sections during dead periods. In practice, the experiment then lasts four times as long, namely 40 minutes, which is also quite excessive. Furthermore, there again arises the same problem of synchronization as that mentioned above. When the heart rate is not constant (over a period of 40 minutes?), the images also exhibit artifacts.

Another technique has been conceived by Michael L. Wood and R. Marc Henkelman (of the Ontario Cancer Institute and Department of Medical Biophysics, University of Toronto, Toronto, Canada). This technique has been published in Medical Physics, Volume 13, No. 6 of November/December, 1986. It essentially consists in determining an average value over a number of successive images in order to eliminate motion artifacts. This imaging technique, which is concerned with elimination of effects of motion of moving parts, is clearly not capable of restituting the moving image of the motion to be recorded. In addition, this technique is not totally effective and certain parasites may remain in the image.

The solution proposed by the invention is a general solution which makes it possible according to requirements to represent the movements of a moving object in slow motion which produces the desired fine-detail resolution without resulting in a corresponding multiplication of acquisition times. Furthermore, in cases in which moving parts are considered as disturbances, the method according to the invention provides an image of the stationary portions of the object which are free from components relating to motion. It is essentially considered in accordance with the invention that the movement of an object is analyzed in an image as a time variation in luminosity of the image elements or so-called pixels of said image. And it is suggested that this time variation in luminosity of a pixel can be replaced by a spectrum of frequency components (of a basic elementary signal when the movement studied is cyclic). The spectral resolution is preferably the so-called Fourier resolution. The time signal of variation in luminosity of each pixel is accordingly replaced in the case of each pixel by the Fourier transform of said luminosity.

In a simple case, when the phenomenon under study is cyclic, it can be considered that the luminosities of the pixels have a continuous component, a fundamental component of cyclic variation as well as harmonic components of cyclic variation. Assuming that the cycle is the same throughout the body under study, resolution of body motion into a Fourier series makes it possible in successive pixels to obtain a series of images which are representative in each case of the fixed image, of the image of variation at the fundamental rate, and of the images of variation at the frequency of the harmonics of the fundamental rate. The total image of motion can then be reobtained by employing as many image generators plus one as there are image harmonics to be recorded. The participations of each harmonic image is combined, pixel by pixel, and the image thus combined is then displayed. In order to obtain slow motion at a speed as low as requirements may dictate, it is only necessary to produce a displacement of the image generators as slowly as may be desired. In fact, a harmonic analysis of the image is thus performed. It should be noted that an image of the moving parts alone can also be obtained by eliminating the continuous image component and that, on the other hand, an image which is free from any motion artifact can be obtained by employing this image of a continuous image component alone.

SUMMARY OF THE INVENTION

The invention is therefore concerned with a method whereby the movements of an object are recorded in an image, as distinguished by the steps which consist:
of determining the components of the analytical transform of the motion,
of producing images corresponding to each of the components of the analytical transform of said motion,
and of composing the image of the moving object by combining the images of the components.

DETAILED DESCRIPTION OF THE INVENTION

Figure 1:
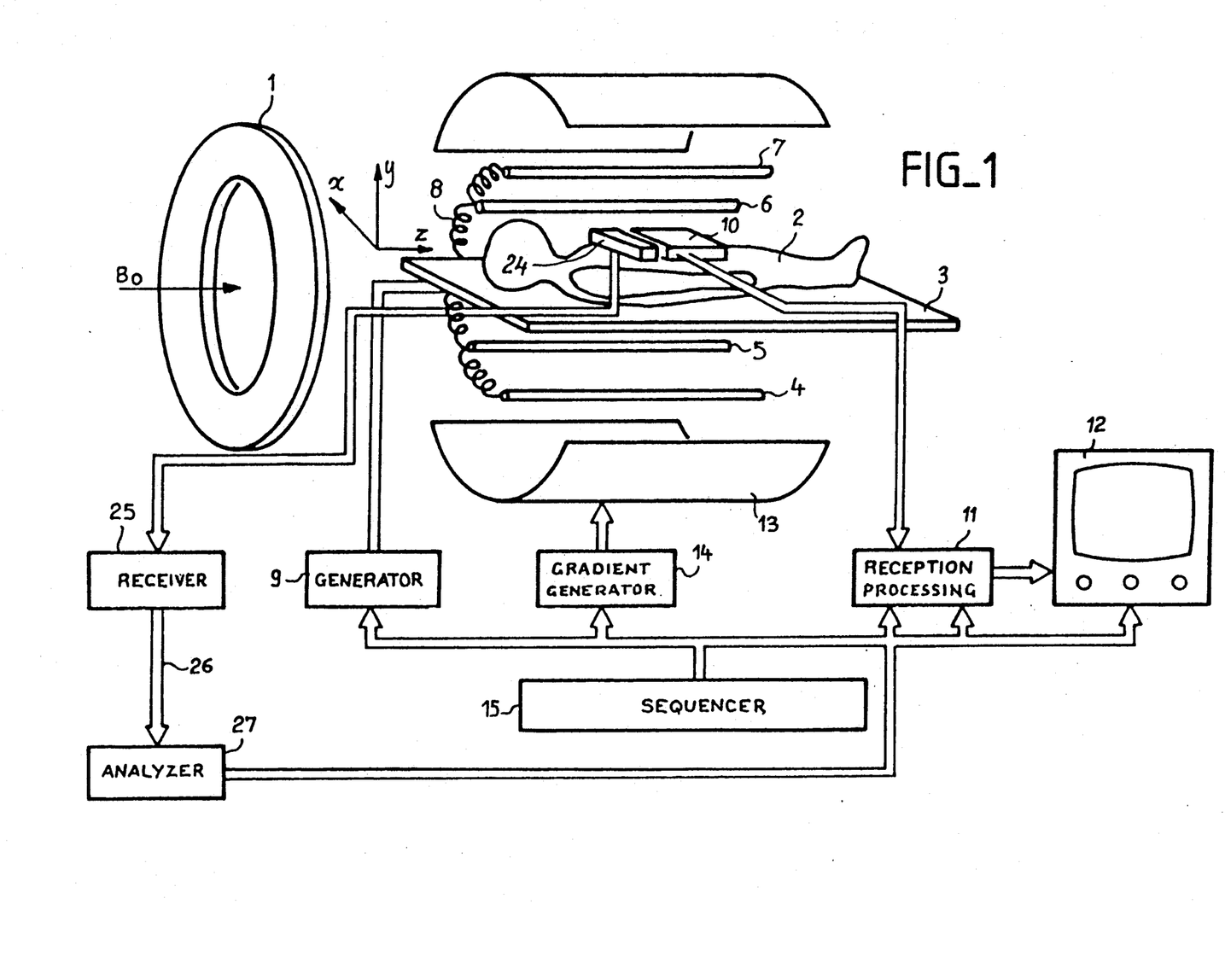
FIG. 1 illustrates a nuclear magnetic resonance (NMR) imaging device for the practical application of the method in accordance with the invention.

FIG. 1 illustrates a nuclear magnetic resonance (NMR) imaging device employed in one example for the application of the method of recording in accordance with the invention. This apparatus essentially comprises means represented by a coil 1 for producing a uniform magnetic field $B_0$ of high strength in a region in which a patient's body 2 is placed on a table 3. When subjected to this magnetization, the magnetic moments of the particles of the body 2 are oriented in the direction of the uniform field $B_0$. In this situation, the body 2 is subjected in addition to a radiofrequency electromagnetic excitation transmitted by an antenna consisting for example of radiating rods 4 to 7 and fed through a resonant circuit 8 by an excitation generator 9. After excitation, a receiving antenna 10 serves to collect the de-excitation signal which marks the return to equilibrium of the magnetic moments of the particles of the body 2. This signal is received and processed in a receiver 11 for displaying an image of a cross-section of the body 2 on a display device 12.

Figure 2A:
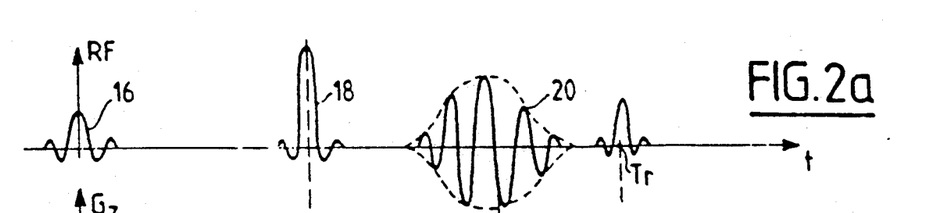
FIGS. 2a to 2d are time-waveform diagrams of coding signals employed in the experiments for reconstruction of images.
Figures 2B, 2C, 2D:
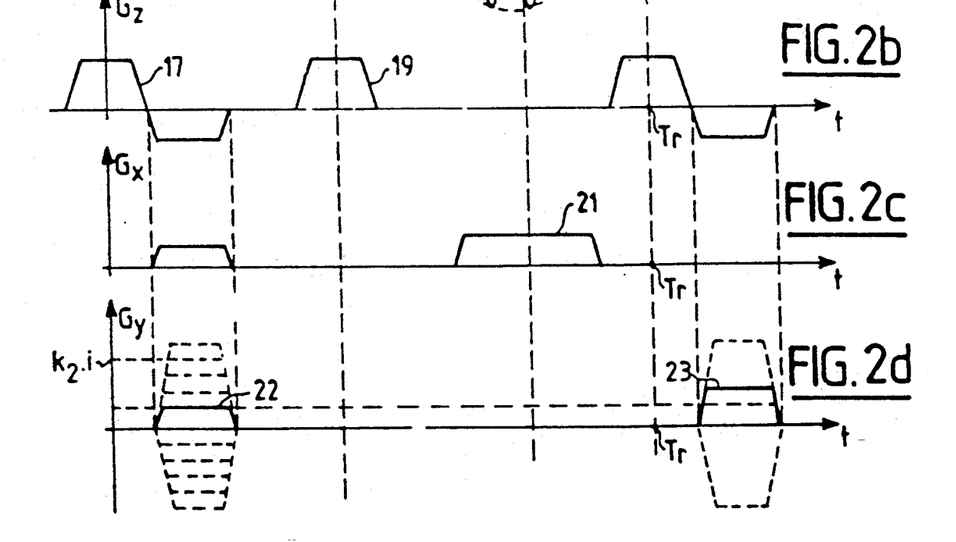

In order to discriminate in the received signal the contributions of each volume element of the cross-section, a series of experiments is undertaken during each of which magnetic coding of the space in which the body 2 is located is fixed at a different value by additional magnetic fields applied by so-called gradient coils shown diagrammatically at 13 and supplied by a gradient pulse generator 14. The complete assembly operates under the control of a sequencer 15. It will be borne in mind that, in practice, the image can be reconstructed in accordance with a preferred method of reconstruction known as 2DFT (i.e. a two-dimensional discrete Fourier transform, such as is shown in U.S. Pat. No. 4,567,249), a general idea of the principal phases of this method being given in FIG. 2. A radiofrequency excitation 16 is applied in the presence of a cross-section selection gradient pulse 17. A radiofrequency pulse 18 or so-called spin echo pulse is emitted subsequently in the presence of a cross-section selection gradient pulse 19 for selecting the same cross-section and eliminating defects in uniformity of the field $B_0$. During reception of the de-excitation signal 20, a so-called "read" gradient pulse 21 is applied (axis X). Between the pulse 16 and the pulse 18 a phase coding 22 of the NMR signal is applied. From one experiment to the next (at the end of a time interval Tr), this phase coding undergoes a variation and thus attains the level 23, for example, during the following experiment. The image reconstruction computation is known and comprises two Fourier transforms: one on $k_1$ which is dependent on the read gradient and one on $k_2$ which is dependent on the phase-coding gradient. During an experiment of order i, the phase-coding gradient has the value $k_2 \cdot i$.

The body 2 is clearly not motionless during all these experiments, in particular on account of the patient's heartbeats. In consequence, the images acquired are altered by these movements. In order to determine the influence of these movements it is sought in accordance with the invention to determine the analytical transform of motion. In a first step, in order to simplify the explanation, this analytical transform may be considered as the Fourier transform. The analysis depends in fact on the space of the functions employed, namely in this case the Fourier functions. To this end, a heart motion detector 24 is placed in proximity to the moving parts and in particular in this case close to the heart. This detector 24 (of the same type as those employed in conventional cardiac synchronization) is connected to a receiver 25 which produces a signal 26 representing the heart motion. The receiver 25 is in relation with an analyzer 27 which is capable of giving the basic cycle of the motion at the output. By virtue of the fact that the heart motion is cyclic, analysis of this motion actually consists in measuring the duration of this cycle. The image harmonics in accordance with the invention are then computed in accordance with a method described hereunder.

Consider a magnetic moment M (y,t) of a particle whose amplitude is a function of the locus y of the particle and of the time t in the following manner:

$$M(y,t) = a_0(y) e^{jA \sin wt} \quad \text{I}$$

In this expression, $a_0$ indicates the amplitude of the value of this magnetic moment as a function of time, j is such that $j^2 = -1$, and w represents the angular frequency of a sine-wave signal (a pure sine-wave signal is therefore considered in this case). The expression of M may also be written:

$$M(y, t) = a_0(y) + a_0(y) j \frac{A}{2} e^{jwt} - a_0(y) j \frac{A}{2} e^{-jwt}$$

or else as a first approximation $$M(y,t) = a_0(y) + a_1(y) e^{jwt} + a_{-1}(y) e^{-jwt}$$

During an NMR excitation, the magnetic moments of the particles located at an ordinate y do not contribute alone to the NMR signal received by the antenna 10. They contribute thereto in common with those of adjacent particles which are located at the same abscissa x but at another ordinate y as well as with those located at other abscissae x and even at other heights z (see the reference axes in FIG. 1). Assuming that the codings produced during sequences by the gradient-pulse generator 14 have had the effect of confining the production of a utilizable NMR signal to a predetermined slice of the body 2 (a cross-section selection results in the formation of a two-dimensional image) and if a read gradient 21 has been applied at the moment of detection of the signal by the antenna 10, it is possible after frequency filtering or after computation of a Fourier transform to extract from the received signal a signal which can be written as follows:

$$s(x, i \cdot Tr) = \int y e^{jk_2 \cdot i \cdot y} M(y, i \cdot Tr) \, dy$$

This expression means that the detected signal is collected during an excitation-measurement sequence of order i. Since the sequences each have a time-duration Tr, the signal is therefore detected at the date $i \cdot Tr$. The NMR signal at this instant is therefore the integral (dy) of the magnetic moment of all the particles which are located along Y. For each particle located in a volume element having an ordinate y, once the resonance signal has been coded by a phase-coding gradient having an amplitude $k_2 \cdot i$ (since it is applied during the sequence of order i), the relative phase has the value $k_2 \cdot i \cdot y$. In this expression, M can be replaced by its value which is a function of $a_0$, $a_1$, and $a_{-1}$. If it is considered in addition, in a particular case which will be subsequently generalized, that an NMR signal has been emitted at $y_0$ alone, the signal s becomes (now disregarding the influence of x which, from this point of view, does not modify the sense of the expressions):

$$s(i \cdot Tr) = a_0(y_0) e^{jk_2 \cdot i \cdot y_0} + a_1(y_0) e^{jk_2 \cdot i (y_0 - wTr/k_2)} + a_{-1} \ldots$$

It may accordingly be considered that the first part (in $a_0$) of the second expression of the equation concerns the contribution of the stationary particles at the location of the volume element $y_0$ whereas the following part (in $a_1$ and $a_{-1}$) concerns the moving particles in the volume element $y_0$. It will now be assumed that a number NE of identical successive experiments are performed with the same value of $k_2 \cdot i$. It may be concluded that, instead of acquiring a series of 2N sequences (with i ranging from $-N$ to $N-1$; in a typical example in which $2N = 256$, i ranges from $-128$ to $+127$) it is possible to acquire NE (for example NE=8 in order to fix ideas) identical sequences in respect of each value of i. One therefore acquires a total of NE×2N sequences (see FIG. 3). The NE sequences are identical except for the fact that the instants of acquisition are not the same and are naturally displaced in time. Let it be assumed in addition that the signal considered is not a pure sine-wave signal but is in fact a periodic signal which has a fundamental angular frequency w but contains in addition certain harmonics. If p(t) designates the signal representing the phase of the fundamental angular frequency of variation of the periodic signal, we may write:

$$M(y_0, 1) = a_0(y_0) + a_1(y_0) e^{jp(1)} + a_{-1}(y_0) e^{-jp(1)} + a_2(y_0) e^{j2p(1)} + a_{-2}(y_0) e^{-j2p(1)} + a_3(y_0) e^{j3p(1)} + a_{-3}(y_0) e^{-j3p(1)} + \ldots \quad \text{II}$$

In this expression, l designates the order of one of the experiments considered among the NE sequences which have been retained. In fact, it indicates the date $1 \cdot Tr$ at which the NMR signal is measured. In practice, l has a value between 0 and NE−1. The expression just given contains in substance the whole essence of the invention. $M(y_0, 1)$ represents the luminosity to be represented by a point of ordinates $y_0$ at a date l. The value $a_0(y_0)$ represents the continuous component of luminosity at this point of the image and is independent of time since it is a continuous component. The terms in $a_1$ and $a_{-1}$ represent, as a function of the fundamental p(1) and of the time l, the influence of the weighting coefficients of said fundamental at the point of the ordinate $y_0$. The terms in $a_2$ and $a_{-2}$ represent the same influences in respect of the harmonic 2 (2p(1)) and so on in sequence. In other words, in the case of a locus $y_0$, to determine the value of the magnetic moment M (or, equivalently, the luminosity of a corresponding point on the image) entails the need to determine the coefficients $a_0$ and $a_n$ and $a_{-n}$ up to n having a value as high as may be desired so as to represent the movement quite clearly. It is known that, in order to represent the modulation of the starting signal, resolution into a Fourier series makes it possible to limit the harmonics to a small number, namely those whose coefficients $a_n$ still have a significant value. In the following explanation, the limit considered will be n=3 although this does not constitute an essential requirement. It is necessary, however, to recall the application of the Shannon theorem in which a signal at a frequency nw is fully determined only if the number of samples recorded is greater than 2 during a time interval 1/nw. It can be demonstrated that, in the present case in which the value chosen is NE=8, it is therefore wholly feasible to determine the third harmonic (8 is greater than 2×3+1).

If the NE=8 measurements are performed as planned, one is in that case confronted with a situation in which 8 values of the signal s(1·Tr) are available whereas there are in fact sought only 7 unknown factors which are $a_0, a_1, a_{-1}, \ldots a_3$. The solution of this system of equations can be provided by a method of approximation and more specifically, from a practical standpoint, a method of approximation by least squares.

In a particularly simple case in which NE measurements are performed during a time interval exactly equal to the fundamental period of the cyclic phenomenon under study and in which the angular frequency of the fundamental is constant in time, it is possible after computation to arrive at the following simple solution:

$$a_0 = 1/8 \sum_{l=0}^{l=7} s \cdot (1 \cdot Tr)$$

$$a_1 = 1/8 \sum_{l=0}^{l=7} e^{-j\frac{2\pi}{8} \cdot l \cdot 1} \cdot s(1 \cdot Tr)$$

$$\ldots$$

$$a_{-3} = 1/8 \sum_{l=0}^{l=7} e^{j\frac{2\pi}{8} \cdot l \cdot 3} \cdot s(1 \cdot Tr)$$

The last two expressions serve to show that $a_h$ is in fact the weighting coefficient of the Fourier component of order h of the resolution into a Fourier series of the cyclic phenomenon in question. However, in this case in which the frequency is not constant or else in the case in which NE measurements are not exactly distributed over a motion cycle, the functions $e^{jp(1)}$ are no longer orthogonal. The process of computation of the $a_h$ coefficients must be generalized in the form, for example, of computation of least squares. This computation is made necessary by the fact that, in these cases, resolution of the magnetization time function is no longer performed on a base of orthogonal analytical functions. In other words, the base of the analytical functions chosen does not need to be orthogonal on condition that an approximation of the $a_h$ coefficients is undertaken. By assimilating M with s insofar as only one volume element of ordinate $y_0$ of the body 2 emits a response on completion of experiments, the last formulation II of $M(y_0,1)$ results in the following matrix formulation:

$$\begin{vmatrix} 1 & e^{jp(0)} & e^{2jp(0)} & \ldots & e^{-3jp(0)} \\ 1 & e^{jp(1)} & e^{2jp(1)} & \ldots & \\ \ldots & \ldots & \ldots & \ldots & \\ 1 & e^{jp(1)} & \ldots & \ldots & \\ 1 & e^{jp(7)} & \ldots & \ldots & e^{-3jp(7)} \end{vmatrix} \cdot \begin{vmatrix} a_0 \\ a_1 \\ a_2 \\ \ldots \\ a_{-3} \end{vmatrix} = \begin{vmatrix} s(0) \\ s(1) \\ \ldots \\ s(1) \\ s(7) \end{vmatrix}$$

In this equation, the sign = has a meaning which must therefore be interpreted in the sense of computation by the method of least squares. This equation may also be written $$|P| \cdot |\text{``}a\text{''}| = |S|$$

This matrix formulation takes into account the values of the different signals s(1·Tr) as a function of the harmonics (np(1)) of the movement considered. In the final analysis, what is unknown is the vector "a" whereas what is known is the vector S as well as the matrix P. The matrix P is known since one knows the fundamental cycle 1·p(1), the harmonics h·p(1) and since one also knows the instants 1·Tr at which the samples are taken. In order to apply the method of least squares, the theory of matrix computation makes it possible to write the following:

$$|\text{``}a\text{''}| = [|P^*| \cdot |P|]^{-1} \cdot |P^*| \cdot |S|$$

In this expression, P* represents the matrix which is conjugate with respect to the matrix P so that each element $q_{ij}$ of P* is such that $q_{ij} = P_{ji}^*$ if $P_{ji}$ is an element of P. The exponent −1 corresponds to a matrix inversion, the definition of which is such that $P \cdot P^{-1} = I$, where I is the identity matrix. With the method just mentioned, it is therefore possible to compute the vector "a". This computation is performed in accordance with the method of least squares.

It is now important to extend the explanation in a general sense to the case in which there is not only a point $y_0$ which emits a useful signal. In fact, in a nuclear magnetic resonance (NMR) imaging experiment, and in a cross-section at the moment of reading, all the particles located in the same column (therefore having a different ordinate y and the same abscissa x) contribute to the signal. Assuming that the $a_n$ values are known, it may be written that, at an ordinate locus y and at a date l, the magnetic moment corresponds to an amplitude of the form:

$$M(Y, 1) = \sum_{h=-n}^{h=+n} a_h(y) \cdot e^{j \cdot h \cdot p(1)} \qquad \text{III}$$

as already seen earlier but generalized in this case to all coordinates and to all harmonics.

Since all the signals located at the same abscissa x and having an ordinate y participate at the same time in the received signal, we may write:

$$s(1) = \int_Y e^{jk_2 \cdot i \cdot y} \left( \sum_{h=-n}^{h=+n} a_h(y) e^{jhp(1)} \right) dy$$

which is an integral expression from which may be drawn the following expression:

$$s(1) = \sum_{h=-n}^{h=+n} \left( \int_Y e^{jk_2 \cdot i \cdot y} \cdot a_h(y) dy \right) e^{jhp(1)}$$

In this last expression, it may be postulated that the integral can be written in the form $A_h{}^i$. This formulation in fact rests on a certain number of assumptions. It is assumed in the first place that, during the NE×2N measurements performed, the coefficients $a_h$ are constant. This means in the final analysis that the phenomenon is stationary (but not that its cycle is of constant duration). Although it does not have a constant frequency, it must be possible on the other hand to deduce its form of motion from one cycle to another solely by time compression or expansion. In this expression, i represents the coding $i \cdot k_2$ whilst h depends on the harmonic considered. The previous vector "a" having seven components in respect of three harmonics now becomes a generalized matrix designated as A having $(2n+1) \cdot 2N$ dimensions. In the example, the matrix has $7 \times 256$ dimensions. The figure 256 represents the desired resolution of the image as well as the desired number of different values of $k_2 \cdot i$. This matrix can be written:

$$A = \begin{vmatrix} A_0^0 & A_0^1 & \ldots & A_0^{256} \\ A_1^0 & A_1^1 & \ldots & A_1^{256} \\ A_{-1}^0 & A_{-1}^1 & \ldots & A_{-1}^{256} \\ \ldots & \ldots & \ldots & \ldots \\ \ldots & \ldots & \ldots & \ldots \\ A_{-3}^0 & A_{-3}^1 & \ldots & A_{-3}^{256} \end{vmatrix}$$

The matrix A corresponds in respect of all sequences i to the contributions of all the particles of one and the same column to the stationary image ($A_0$), to the images of the fundamental ($A_1$, $A_{-1}$) or to the images of the harmonics ($A_n$, $A_{-n}$). In each sequence, in respect of each value of $i \cdot k_2$ and taking into account the fact that l signals have been acquired, it is possible to calculate the coefficients $A_h{}^i$ by the method of least squares. In other words, at each series of NE measurements in respect of a predetermined value $i \cdot k_2$, it is possible to determine the coefficients $A_h{}^i$ in question. It is in fact of interest, however, to determine the coefficients $a_h(y)$. It is therefore important to form Fourier transforms by making use of the fact that multiple experiments $i \cdot k_2$ are available (in which case it is said that a Fourier transform is formed "on $k_2$") in order to recover the coefficients $a_h(y)$. These Fourier transforms on $k_2$ are identical with the transform formed in a method of image reconstruction of the conventional 2DFT type. The only distinctive feature of the invention lies in the fact that these last-mentioned Fourier transforms are formed in this case $2n+1$ times since it is sought to determine in respect of each image element or pixel of the image, not a single value of luminosity, but the $2n+1$ values $a_0$, $a_1$, $a_{-1}$, ... $a_{-n}$ of the image harmonics.

Figure 4:
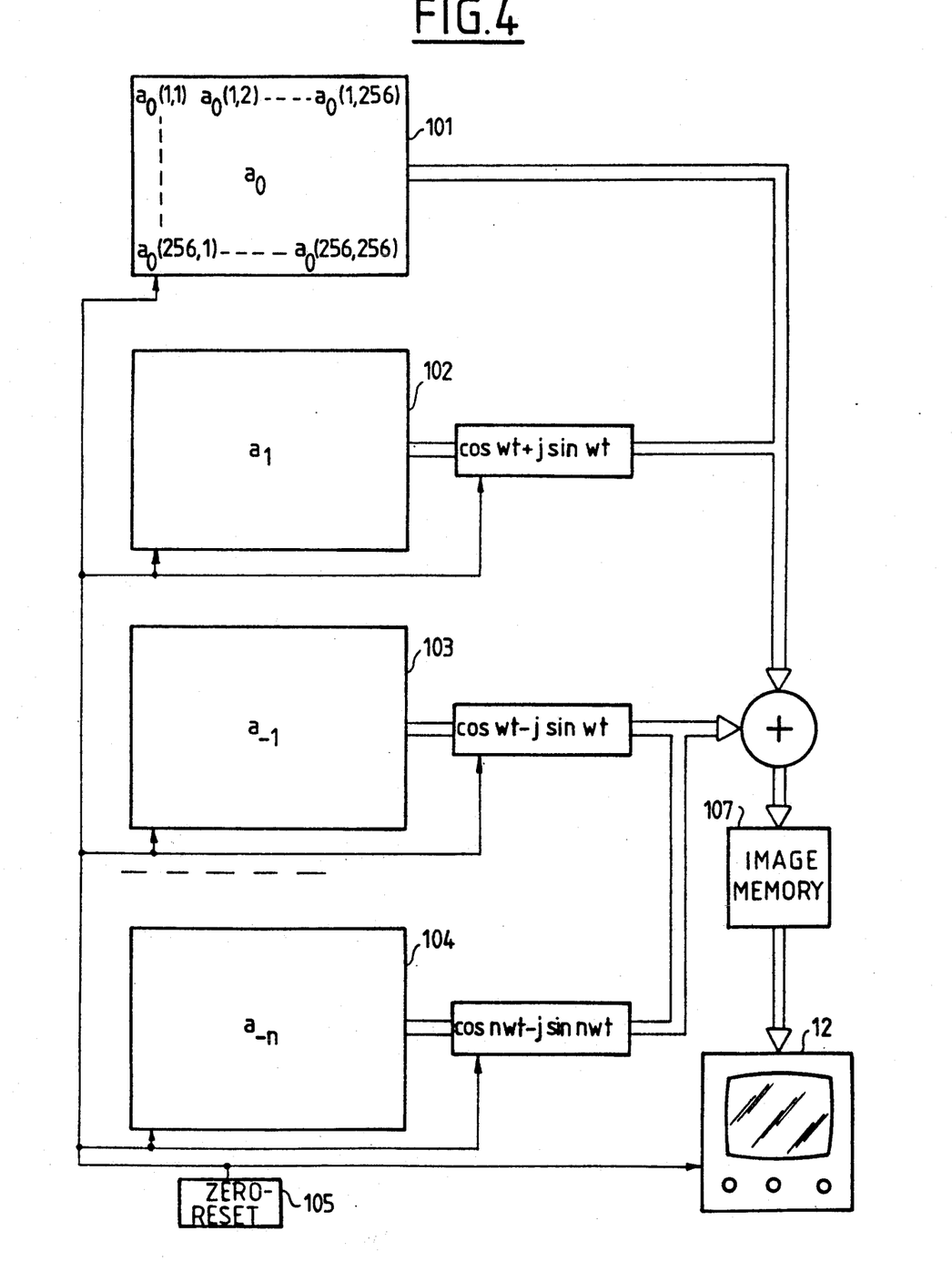
FIG. 4 illustrates a device which is useful for composition of the combined image.

FIG. 4 shows how the image of the moving elements is subsequently recombined. Provision is made in practice for $2n+1$ image memories numbered from 101 to 104. These image memories are intended to be read simultaneously under the control of a zero-reset device 105. Their contents are added, pixel by pixel, in an adder 106 for the purpose of supplying another image memory 107 which may in turn be read by the display device 12. In accordance with the invention, the values of the image memories (pixel by pixel) are multiplied by a function $\cos h \, wt + j \sin h \cdot wt$ prior to addition. Multipliers 108 to 110 are thus shown to this end. The value t is not necessarily taken at the rate at which it varies in real time. Should it be desired to have a very finely represented slow motion, the value t is caused to vary at a very low rate while reading the image memory 107 at a rate compatible with a conventional video read (25 images per second). In short, in the example herein described, only eight times more information (NE=8) have been acquired and it is possible to have a slow motion as finely represented as may be desired (by producing a slight variation in the value of t). However, the invention also provides another advantage. If it is considered that any kind of motion is of no interest, it may be eliminated by taking into account only the coefficients of the matrix $a_0$ contained in the image memory 101. In this manner, motion artifacts are simply eliminated.

A number of problems now remain to be dealt with. The first relates to the variation in the basic cycle w of the movement studied throughout all the measurements. In fact, if the time-duration of this latter is of the order of five minutes, the heart rate cannot be considered as constant during a time interval of this order. However, with the detector 16, the receiver 17 and the analyzer 18, it is possible to determine not only the cardiac cycle but even the variations of this cycle. It may be assumed in a first stage that the variations of said cycle will be small, with the result that the number of samples to be recorded, considering the number of harmonics which it is sought to represent, will always respect the constraints opposed by Shannon. Should this not be the case, it is quite simply sufficient to increase the number of samples by the necessary quantity.

One then reverts to the following situation: the instants l at which the measurements are performed are known in the absolute since they are imposed by the sequencer. But their relative position with respect to the fundamental cycle varies. This only has the effect of slightly complicating the calculation of $e^{jhp(l)}$ since, under these conditions, the matrix P varies from one sequence to another. The phase p(l) can be written:

$$p(l) = \int_0^{l \cdot Tr_w} (t)dt$$

In fact, the form of the movement is not measured in the analyzer 27 if this movement is cyclic. Thus it is considered sufficient to measure the time of appearance of a characteristic event of the cycle being measured. By definition, the phase of the fundamental angular frequency at the time of appearance of this event is $2\pi$ (in fact $k \cdot 2\pi$). It is assumed (but this can be generalized) that contraction or expansion of the cycle is uniform between two successive events. In this case, the phase of a measurement of order l comprised between the events k and k+1, is accordingly $p(l) = (l \cdot Tr - T(k)/(T(k+1) - T(k))$. If the variation of the cycle is not uniform, it is only necessary to make a non-linear interpolation between T(k) and T(k+1). A non-linear interpolation of this kind is found preferable for studying the heart since, in the event of acceleration of the heart rate, the diastole accelerates at a relatively higher rate than the systole. Thus in this particular case, determination of the components of the analytical (Fourier) transform of the motion in fact consists in measuring the arrival of a characteristic event and in measuring the relative phase by interpolation (whether linear or not).

It is also possible to study the case in which the motion is not only created by a single periodic movement but by two imbricated periodic movements. In practice, consideration is thus given to simultaneity of the heartbeat and of the breathing rate. There is no reason why one should be a multiple of the other. In practice, all that has been stated thus far may be generalized since the combination of two movements can be analyzed as a modulation by multiplication of one movement by the other. The spectrum of resolution into a Fourier series which has to be taken into account is accordingly equivalent to the spectrum of the lower-rate pulsation displaced from the values of the fundamental and from the harmonics of the spectrum of the higher-rate pulsation.

Figure 3:
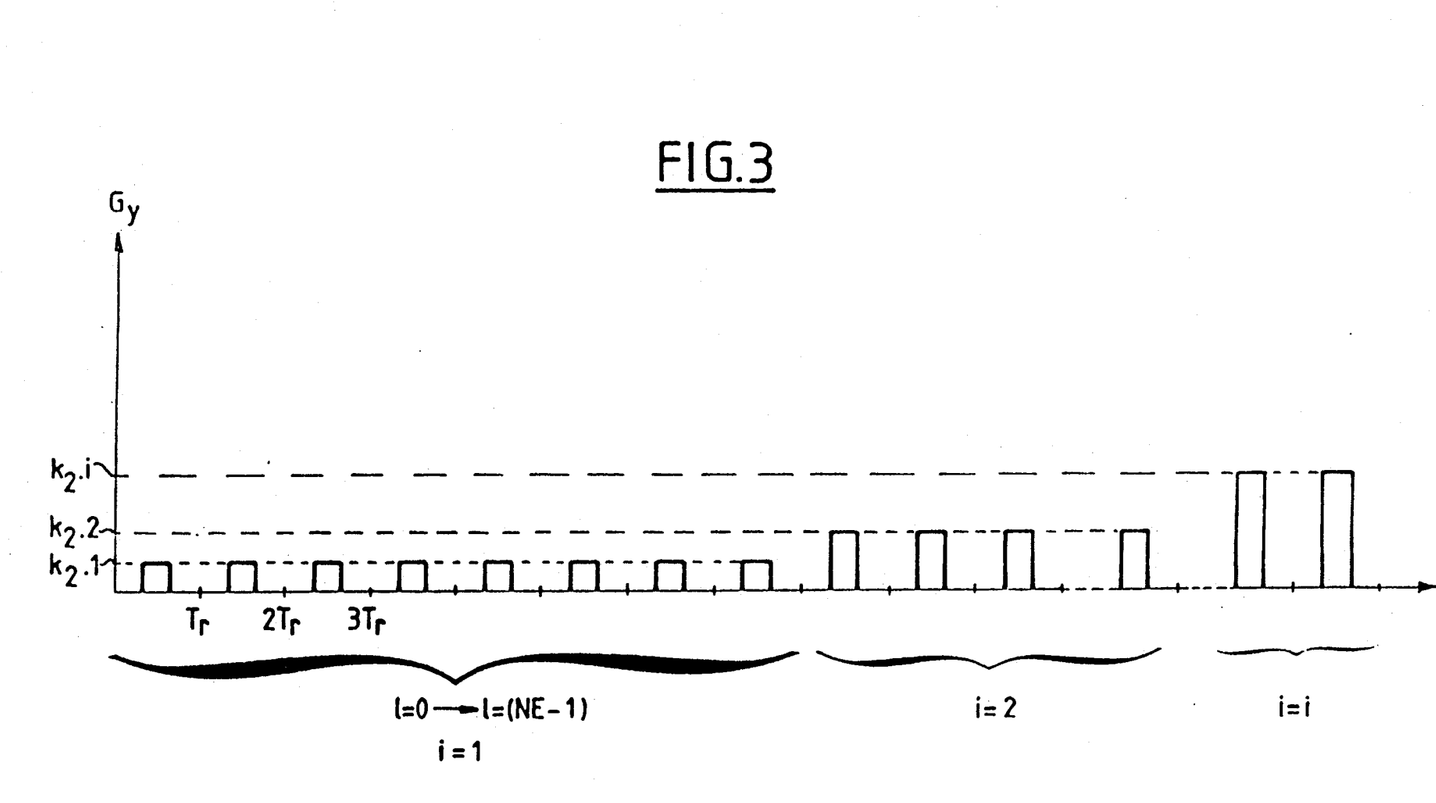
FIG. 3 shows the modification of one of the coding signals for carrying into effect one example of the method in accordance with the invention.

In FIG. 3, there are shown series of experiments with the same values of $k_2 \cdot i$ which follow each other consecutively. It is possible, however, to interlace equal values of $k_2 \cdot i$ with other values of $k_2 \cdot i$. This assumption is all the more justified by the fact that the method in accordance with the invention is compatible with an SSFP excitation mode, the natural period of which can be very low (soon a few milliseconds). In a cardiac cycle of one second, it accordingly becomes possible to carry out several trains of sequences at different but interlaced values $i \cdot k_2$: for example a train comprising successively a sequence $i \cdot k_2$, a sequence $(i+1) \cdot k_2$ followed by a train comprising successively a sequence $(i+2) \cdot k_2$, a sequence $(i+3) \cdot k_2$, and so on.

Moreover, resolution of the motion into a Fourier series is solely justified insofar as sine-wave functions are employed in the multipliers 108 to 110, which appears to be the most simple solution. However, consideration can be given to the possibility of resolving the motion in accordance with other analytical functions which may be of justifiable interest for one reason or another. It is for this reason that, in the appended claims, the principal claim mentions an analytical transform which is in fact a Fourier transform when analysis of motion is a Fourier analysis.

It may be stated by way of conclusion that, within the scope of an NMR imaging application, the method in accordance with the invention involves the following steps. In each experiment, the body is excited, the space is magnetically coded, and reading of the signal re-emitted by the particles is carried out. The presence of a read gradient during this reading operation makes it possible by forming a Fourier transform on the read axis (usually the x-axis) to provide in respect of NE measurements with a phase-coding gradient $i \cdot k_2$ and in respect of all possible values of said phase-coding gradient a set of values of signals detected as a function of their acquisition date (1) and of the coding to which they have been subjected ($i \cdot k_2$). During measurement of the re-emitted signals, there is also carried out a measurement of the rate of motion of moving parts (of the heart rate, for example). Useful variations p(1) are then determined with respect to said measured rate while taking account in particular of possible variations in said rate throughout all the measurements. Provision is therefore made for the matrix P which can be employed for each series of NE sequences. There is then computed $|P^* \cdot P|^{-1} \cdot P^*$ in respect of one value of $i \cdot k_2$ or in other words in respect of NE measured signal values. There are thus computed the values $A_h{}^i$ relating to the sequence $i \cdot k_2$ in one example in which h belongs to $-3, +3$. This calculation is reiterated as many times as there are different values $i \cdot k_2$.

By obtaining all the values $A_h{}^i$, there are then computed by $2n+1$ Fourier transforms on $k_2$ all the values $a_h(y)$ assigned to each of the ordinates y of the points of a column having an abscissa x. The same operation is performed for all the abscissae x of the plane and image memories are then arranged as shown in FIG. 4. Recombination of the image is then carried out as a function of what it is sought to demonstrate. Since the production of images is performed by computation in complex numbers (j), it may be decided in known manner to show the real image, the imaginary image or even the module image. Should this be made necessary by display requirements, it is even possible to modulate certain images whether stationary or moving by means of a contrast coefficient so as to underline or erase certain parts of the recombined image.

What is claimed is:

1. A method for displaying a moving object so that the characteristics of the object may be observed and interpreted, said method comprising the steps of:
   a. exciting the object to produce time-varying data representative of the moving object;
   b. determining the components of an analytical frequency transform of said time-varying data;
   c. producing at least one signal corresponding to one of said components of said analytical frequency transform;
   d. temporally modifying said at least one signal; and
   e. displaying the modified signal for observation and interpretation.

2. A method according to claim 1, wherein said analytical frequency transform is a Fourier transform.

3. A method according to claim 2, wherein the data representative of the moving object are resolved into a Fourier series in order to produce the components of said Fourier transform.

4. A method according to claim 3 wherein, in order to produce said at least one signal, a generalized matrix inversion is performed in order to apply an algorithm of least squares.

5. A method according to claim 3 or claim 4, wherein the period of a basic cyclic movement of the object is measured in order to carry out resolution.

6. A method according to claim 1, wherein contrast coefficients are assigned to the signals corresponding to the components and the signals are then added.

7. Utilization of the method according to claim 1 in a method of nuclear magnetic resonance imaging.

* * * * *